United States Patent [19]

Suzuki

[11] 4,422,050
[45] Dec. 20, 1983

[54] SINGLE-ENDED PUSH-PULL AMPLIFIER WITH TWO COMPLEMENTARY PUSH-PULL CIRCUITS

[75] Inventor: Kenji Suzuki, Hamamatsu, Japan

[73] Assignee: Nippon Gakki Seizo Kabushiki Kaisha, Hamamatsu, Japan

[21] Appl. No.: 279,253

[22] Filed: Jul. 1, 1981

[30] Foreign Application Priority Data

Jul. 9, 1980 [JP] Japan .................. 55-93420

[51] Int. Cl.³ ............................................ H03F 3/26
[52] U.S. Cl. .................................. 330/263; 330/268
[58] Field of Search ........................ 330/263, 264, 268

[56] References Cited

U.S. PATENT DOCUMENTS 3,968,450 7/1976 Suzuki ................................ 330/264

Primary Examiner—James B. Mullins
Assistant Examiner—Gene Wan
Attorney, Agent, or Firm—Frishauf, Holtz, Goodman and Woodward

[57] ABSTRACT

An single-ended push-pull amplifier comprises first and second complementary single-ended push-pull circuits connected in parallel across a power source. Each push-pull circuit has paired complementary transistors and an output connected together to drive a common load such as a loudspeaker. Inputs of the first and second push-pull circuits are connected with a bias circuit connected to receive an audio signal to be amplified. The first to fourth transistors are so controlled that the first and second transistors are operated Class A at small signal levels, and the first and fourth complementary transistor pair and the second and third complementary transistor pair are operated Class B at large signal levels, thus producing a low distortion factor and a high power efficiency.

15 Claims, 8 Drawing Figures

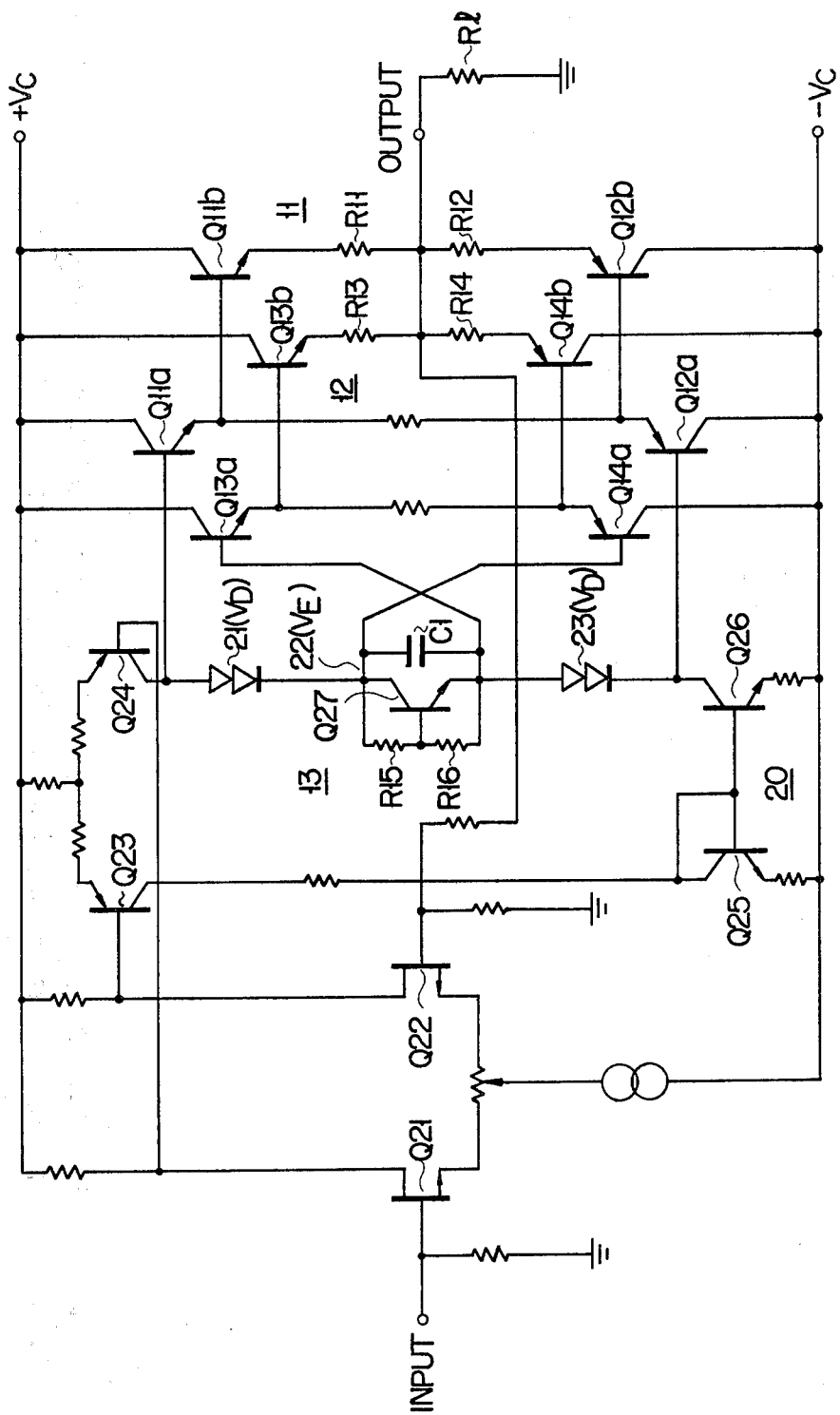
F I G. 5

SINGLE-ENDED PUSH-PULL AMPLIFIER WITH TWO COMPLEMENTARY PUSH-PULL CIRCUITS

BACKGROUND OF THE INVENTION

The present invention relates to an audio signal amplifier, and more particularly to a complementary single-ended push-pull amplifier.

As an amplifier for obtaining a low distortion characteristic, a Class A amplifier and a Class AB amplifier are known. FIG. 1 shows a basic circuit of the Class A push-pull amplifier. In the circuit, a bias voltage $V_E/2 + V_E/2$ is applied between the bases of complementary transistors Q1 and Q2 from bias voltage sources 1 and 2 for operating the transistors Q1 and Q2 in the Class A mode. In the circuit, collector currents I1 and I2 vary in response to a voltage Vi between a connection point of the voltage sources 1 and 2 or an input terminal and the common emitter of the transistors Q1 and Q2, as shown in FIG. 2A. With zero signal input, the collector currents of the transistors Q1 and Q2 are $I_{D1}$ and $I_{D2}$, respectively. The difference between the currents I1 and I2 is supplied to a load Rl such as a loudspeaker, as an output current Io. Since, in such an amplifier, a crossover distortion is not produced over the entire operating range, a distortion factor, especially at small output power levels, is remarkably reduced. The smaller the output power, the larger the collector power dissipation (the collector current in zero signal input condition is selected one half of a maximum output current and the dissipation in this condition is at maximum). Therefore, the power efficiency of the Class A amplifier is remarkably poor, and requires power transistors of high maximum power dissipation rating and large heat sinks.

The Class AB amplifier circuit is so arranged as to improve the above-mentioned disadvantages of the Class A amplifier, in which a base bias voltage $V_E/2 + V_E/2$ is selected for Class AB operation, as shown in FIG. 2B. In the Class AB amplifier, its efficiency can be improved with a distortion factor at small output power levels kept approximate to that in the Class A operation. When an input signal level becomes larger, however, since either of the transistors Q1 and Q2 is rendered cut-off, the mutual conductance gm of the push-pull circuit becomes about half as large as that when both the transistors are on, thus resulting in increase of especially a third harmonic distortion. As mentioned above, in the prior art amplifier circuits, there is a contradiction that improvement of the distortion factor brings about deterioration of the power efficiency and vice versa.

SUMMARY OF THE INVENTION

An object of the present invention is to provide an improved audio amplifier circuit.

Another object of the present invention is to provide a single-ended push-pull amplifier circuit which is improved in the distortion factor and the power efficiency.

According to the present invention, first and second complementary single-ended push-pull circuits are connected in parallel across a power source. The first push-pull circuit has first and second complementary transistors. The second push-pull circuit has third and fourth complementary transistors. The outputs of the first and second push-pull circuits are connected together to a load such as a loudspeaker.

Inputs of the first and second push-pull circuits are connected to a bias circuit which is connected to receive an audio signal to be amplified. The bias circuit controls the first to fourth transistors such that the first and second complementary transistors are operated Class AB, the first and fourth complementary transistors are operated Class B, and the second and third complementary transistors are operated Class B. Namely, under a zero signal input condition, idling currents are allowed to flow through the first and second transistors, and just before the first transistor is rendered cut-off, the fourth transistor starts to conduct, and just before the second transistor is rendered cut-off, the third transistor starts to conduct. This means that when the first and second transistors are switched over to the Class B operation according to input signal levels, the fourth and third transistors start to operate respectively for boosting the collector currents of the first and second transistors.

In other words, according to the present invention, the first and second transistors are operated Class A at relatively small signal levels, while the first and third transistor pair and the second and fourth transistor pair are operated Class B at relatively large signal levels. Therefore, an output current of low distortion may be supplied to the load both at small signal levels and at large signal levels. Since a range of Class A operation of the first and second transistors may be small, i.e. the idling current may be small compared to an ordinary Class A amplifier the collector loss for the first and second transistors are allowed to be small. Accordingly, using transistors having relatively low maximum collector power dissipation, an amplifier with a high efficiency can be formed. Since the third and fourth transistors are operated only at large signal levels, the power dissipation due to these transistors is small.

BRIEF DESCRIPTION OF THE DRAWINGS

FIG. 5 shows a negative-feedback direct-coupled amplifier including a practical arrangement of the single-ended push-pull circuit of the present invention;

DESCRIPTION OF THE PREFERRED EMBODIMENTS

Figure 1:
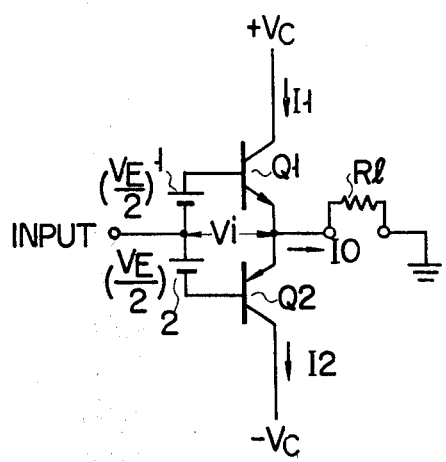
FIG. 1 shows a basic circuit diagram of a prior art Class A complementary single-ended push-pull amplifier.
Figure 2A:
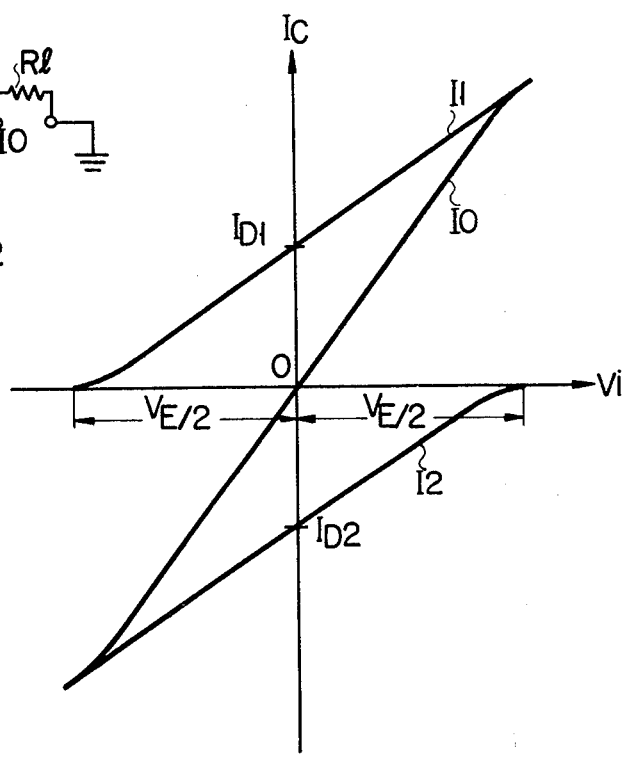
FIGS. 2A and 2B show characteristics for the Class A operation and Class AB operation of the circuit of FIG. 1.
Figure 2B:
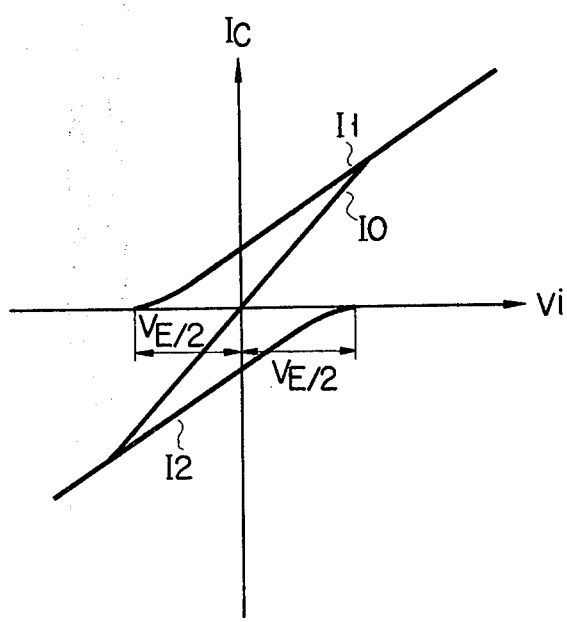
Figure 3:
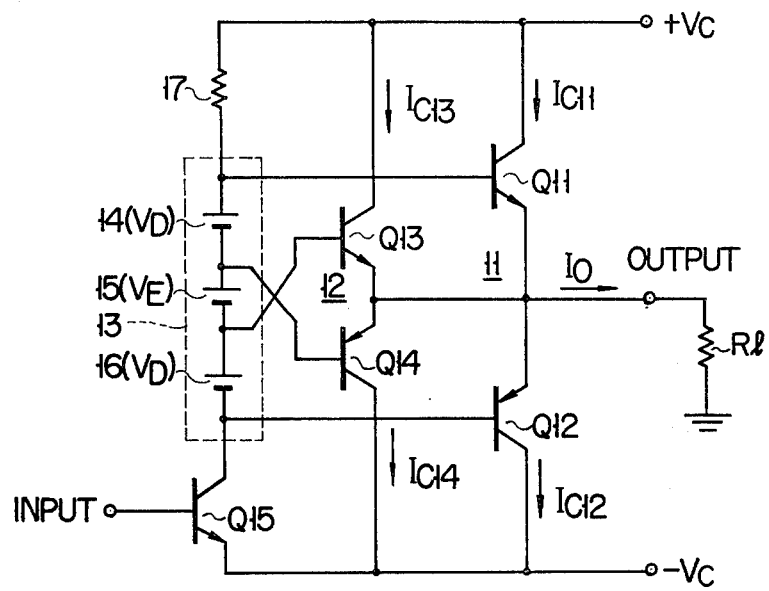
FIG. 3 illustrates a basic circuit diagram of a single-ended push-pull amplifier embodying the present invention.

Referring now to FIG. 3, there is shown an audio amplifier embodying the present invention which is provided with a first complementary single-ended push-pull circuit 11 comprising complementary bipolar transistors Q11 and Q12, and a second complementary single-ended push-pull circuit 12 comprising complementary bipolar transistors Q13 and Q14. Both the first and second circuits 11 and 12 are coupled in parallel between positive and negative power supplies $+V_C$ and $-V_C$. The bases of transistors Q11 to Q14 are connected with a bias circuit 13 which is connected between a driver transistor Q15 to which an input signal is applied and a load resistor 17. Both outputs of the push-pull amplifiers 11 and 12 are connected together to a load Rl such as a loudspeaker.

The first push-pull circuit 11 operates as a main amplifier circuit, whereas, the second push-pull circuit 12 acts an auxiliary amplifier for improving a linearlity of an output current Io supplied to the load Rl at large output power levels.

Figure 4:
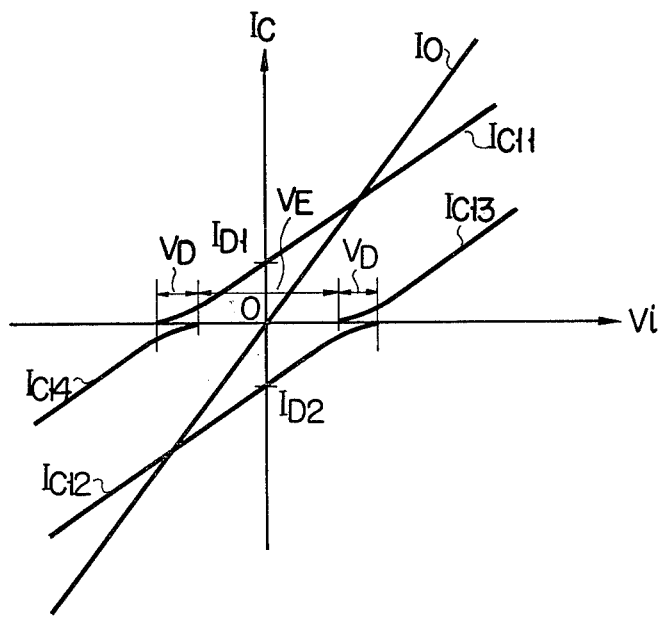
FIG. 4 shows a characteristic of the single-ended push-pull amplifier of FIG. 3.

The transistors Q11 to Q14 are biased by the bias circuit 13 such that collector currents Ic11 to Ic14 flow, as shown in FIG. 4, according to a voltage Vi between a middle point of the bias circuit 13 and an output terminal or commonly connected emitters of transistors Q11 to Q14. The bias circuit 13 has bias voltage sources 14($V_D$), 15($V_E$), and 16($V_D$) such as diodes and applies a bias voltage $V_E+2V_D$ between the bases of the transistors Q11 and Q12, and a bias voltage $V_E$ between the bases of the transistors Q13 and Q14. The transistors Q11 and Q12 are arranged so as to operate in the Class A mode over a range of $-V_E/2-V_D<V_i<V_E/2+V_D$ in response to the base bias voltage $V_E+2V_D$. The transistors Q13 and Q14 are so arranged that the transistor Q13 operates when $V_i>V_E/2$ and the transistor Q14 operates when $V_i<-V_E/2$, since the base of the transistor Q13 is biased negative with respect to the base of the transistor Q14 by the voltage $V_E$. Therefore, the transistor pair Q11 and Q14, and the transistor pair Q12 and Q13 each operate like the conventional Class B push-pull amplifier as seen from FIG. 4. In this case, the bias voltage $V_D$ which is applied between the bases of the transistors Q11 and Q14 and between the bases of the transistors Q12 and Q13 functions to reduce a crossover distortion in the Class B operation.

The bias voltages $V_E$ and $V_D$ are determined in the following manner.

The magnitude of the bias voltage $V_D$ is set to an enough value to supply an idling current for reducing a crossover distortion due to the Class B operation of the transistor pairs Q11 and Q14, and Q12 and Q13 (see FIG. 4). The base bias voltage $V_E+2V_D$ of the transistors Q11 and Q12 is set to have a magnitude which allows the transistors Q11 and Q12 to operate in the Class A mode at relatively small signal levels. This bias voltage may be set either at a bias voltage for the conventional Class AB operation or at a value to make wide the Class A operation range by increasing the idling currents $I_{D1}$ and $E_{D2}$. In other words, the base voltage for the main amplifier 11 may be determined allowing for the efficiency of the amplifier.

The linearity of the output current Io ($=I_{C11}+I_{C13}-I_{C12}-I_{C14}$) supplied to the load Rl is improved as shown in FIG. 4 with the bias voltage for the transistors Q11 to Q14 determined as above. Especially, an odd-harmonic distortion is improved. As seen from FIG. 4, the more approximate the mutual conductances gm of the transistors Q11 to Q14, the better the linearity of the output current Io.

The power efficiency of the circuit shown in FIG. 3 depends on the setting of the bias voltage $V_E$. As mentioned above, the distortions at large signal levels are reduced by the function of transistors Q13 and Q14, so that the voltage $V_E$ may be relatively small. Therefore, the efficiency can remarkably be raised compared with that of the conventional Class A amplifier. For example, if the idling currents Id$_1$ and Id$_2$ are ¼ that of the conventional Class A operation, the power dissipation in an zero signal input condition becomes ¼.

FIG. 5 shows a negative-feedback direct-coupled amplifier including a practical circuit arrangement of an amplifier of the present invention. As illustrated, a main complementary push-pull circuit 11 is comprised of Darlington pairs Q11a, Q11b; and Q12a, Q12b. A connection point of emitter resistors R11 and R12 of the transistors Q11b and Q12b is connected with the load Rl. An auxiliary complementary push-pull circuit 12 is also comprised of Darlington pairs Q13a, Q13b; and Q14a, Q14b. A connection point of emitter resistors R13 and R14 of the transistors Q13b and Q14b is connected with the load Rl.

An input signal is applied to the gate of a transistor Q21 of first stage differential transistors Q21 and Q22. An output signal is fed back to the gate of the other transistor Q22.

Outputs of the first stage differential transistors Q21 and Q22 are connected to the bases of pre-driver stage differential transistors Q23 and Q24 to which a current mirror 20 comprised of transistors Q25 and Q26 and two resistors is connected as a load. A bias circuit 13 which biases the transistors of the complementary push-pull circuits 11 and 12 is connected between the collectors of the transistors Q24 and Q26. The bias circuit 13 is provided with varistor diodes 21 and 23 for producing the constant voltage $V_D$, and a constant voltage circuit 22 for producing the constant voltage $V_E$. The constant voltage circuit 22 has a transistor Q27, a resistor R15 connected between the collector and base of the transistor Q27, a resistor R16 connected between the emitter and base of the transistor Q27, and a capacitor C1 which is connected in parallel with the collector-emitter path of the transistor Q27. By the bias circuit 13 including these constant voltage sources 21, 22, and 23, the bias voltage $2V_D+V_E$ and the bias voltage $V_E$ are applied between the bases of the transistors Q11a and Q12a and between the bases of the transistors Q13a and Q14a, respectively. The base of the transistor Q13a is biased more negative than the base of the transistor Q14a by voltage $V_E$. Therefore, the Darlington pair Q13a and Q13b and the other Darlington pair Q14a and Q14b never conduct simultaneously.

Figure 6:
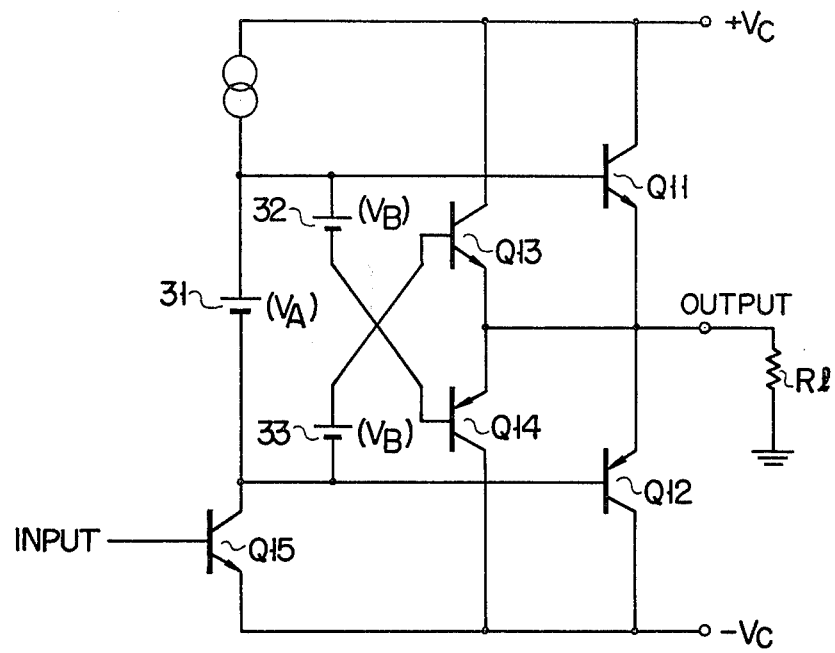
FIG. 6 shows a modification of a bias circuit of the single-ended push-pull circuit of FIG. 3.

The bias circuit 13 shown in FIG. 3 may be modified as shown in FIG. 6. In this embodiment, the bias circuit includes a voltage source 31 for producing a constant voltage $V_A$ and voltage sources 32 and 33 for producing a constant voltage $V_B$. Transistors Q11 to Q14 are connected such that the bias voltages $V_A$ and $V_A-2V_B$ are applied between the bases of the transistors Q11 and Q12, and between the bases of the transistors Q13 and Q14, respectively. The circuit shown in FIG. 6 has such a characteristic as shown in FIG. 4, and therefore the voltages $V_A$ and $V_B$ may be determined in accordance with the following equations.

$$V_A = V_E + 2V_D$$

$$V_B = -V_D$$

Figure 7:
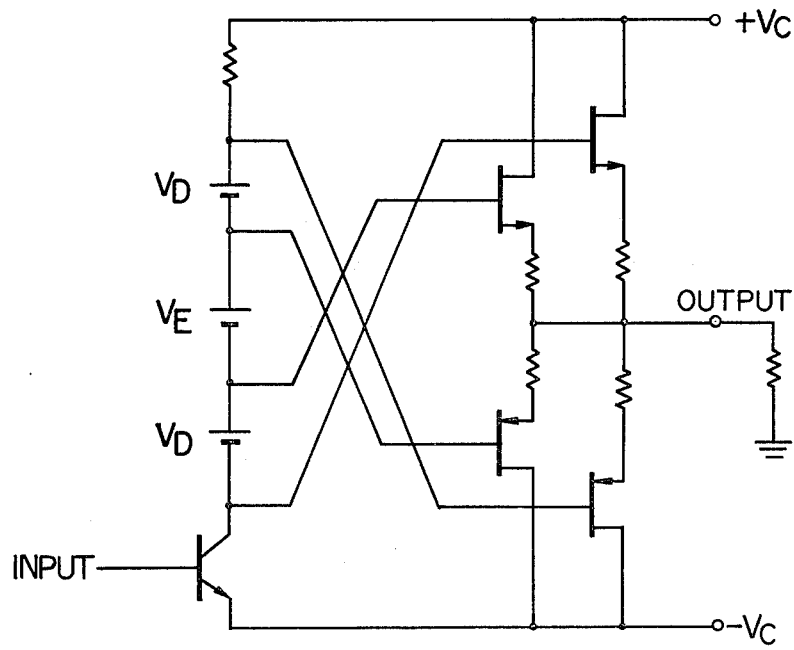
FIG. 7 shows a single-ended push-pull circuit using field effect transistors.

In the above-mentioned embodiments, the complementary push-pull circuits are comprised of the bipolar transistors. As shown in FIG. 7, however, field effect transistors may also be used. When the field effect transistors are used, the crossover distortion will be improved, compared to the case of the bipolar transistors, because of the gate-to-source voltage vs. drain current characteristic.

What is claimed is:

1. An audio amplifier comprising:

first and second complementary single-ended push-pull circuits connected in parallel across a power source and having their outputs connected together, said first push-pull circuit including first and second complementary transistors and said second push-pull circuit including third and fourth complementary transistors, said first and third transistors being in a positive side, and said second and fourth transistors being in a negative side, said output of said push-pull circuits being adapted to be coupled to a load;

an input coupled to said push-pull circuits for receiving an input signal; and a bias circuit coupled to said first and second push-pull circuits for biasing said first to fourth transistors, such that:

idling currents are allowed to flow through said first and second transistors under a zero signal input condition;

said third and fourth transistors are both in a cut-off state when an input signal applied to said first and second push-pull circuits is small;

as said input signal increases in one direction, a current flowing through said first transistor continuously increases, and when said input signal reaches a predetermined magnitude in said one direction, said second transistor is rendered cut-off and said third transistor is rendered conductive, whereby a sum of currents flowing through said first and third transistors is derived as an output current of the amplifier; and as said input signal increases in the other direction, a current flowing through said second transistor continuously increases; and when said input signal reaches a predetermined magnitude in said other direction, said first transistor is rendered cut-off and fourth transistor is rendered conductive, whereby a sum of currents flowing through said second and fourth transistors is derived as the output current of the amplifier.

2. An audio amplifier comprising:

first and second complementary single-ended push-pull circuits connected in parallel across a power source and having their outputs connected together, said first push-pull circuit including first and second complementary transistors and said second push-pull circuit including third and fourth complementary transistors, said first to fourth transistors each having a control electrode, said first and third transistors being in a positive side, and said second and fourth transistors being in a negative side, said outputs of said push-pull circuits being adapted to be coupled to a load;

an input coupled to said push-pull circuits for receiving an input signal; and a bias circuit including first, second and third voltage source means, said first voltage source means being coupled across control electrodes of said first and second transistors, said second voltage source means being coupled across control electrodes of said first and fourth transistors, and said third voltage source means being coupled across control electrodes of said second and third transistors, voltage values of said second and third voltage source means being the same in magnitude as each other and being greater than a voltage value of said first voltage source means;

said bias circuit biasing said first to fourth transistors such that:

idling currents are allowed to flow through said first and second transistors under a zero signal input condition;

said third and fourth transistors are both in a cut-off state when an input signal applied to said first and second push-pull circuits is small;

as said input signal increases in one direction, a current flowing through said first transistor continuously increases; and when said input signal reaches a predetermined magnitude in said one direction, said second transistor is rendered cut-off and said third transistor is rendered conductive, whereby a sum of currents flowing through said first and third transistors is derived as an output current of the amplifier; and as said input signal increases in the other direction, a current flowing through said second transistor continuously increases; and when said input signal reaches a predetermined magnitude in said other direction, said first transistor is rendered cut-off and said fourth transistor is rendered conductive, whereby a sum of currents flowing through said second and fourth transistors is derived as the output current of the amplifier.

3. The audio amplifier of claim 1 or 2, wherein:

said first and third transistors are of a first conductivity type, and said second and fourth transistors are of a second conductivity type of a polarity opposite to that of said first conductivity type;

said first and second transistors are arranged to perform a Class AB push-pull operation;

said first and fourth transistors are arranged to perform a Class B push-pull operation; and said second and third transistors are arranged to perform a Class B push-pull operation.

4. The audio amplifier of claim 3, wherein said first to fourth transistors are bipolar transistors.

5. The audio amplifier of claim 1 or 2, wherein said first to fourth transistors are bipolar transistors.

6. The audio amplifier of claim 3, wherein said first to fourth transistors are field effect transistors.

7. The audio amplifier of claim 1 or 2, wherein said first to fourth transistors are field effect transistors.

8. The audio amplifier of claim 1 or 2, wherein each of said first to fourth transistors is comprised of a Darlington-connected transistor pair.

9. The audio amplifier of claim 3, wherein each of said first to fourth transistors is comprised of a Darlington-connected transistor pair.

10. The audio amplifier of claim 4, wherein each of said first to fourth transistors is comprised of a Darlington-connected transistor pair.

11. The audio amplifier of claim 5, wherein each of said first to fourth transistors is comprised of a Darlington-connected transistor pair.

12. The audio amplifier of claim 6, wherein each of said first to fourth transistors is comprised of a Darlington-connected transistor pair.

13. The audio amplifier of claim 7, wherein each of said first to fourth transistors is comprised of a Darlington-connected transistor pair.

14. The audio amplifier of claim 2, wherein:

said first to third voltage source means comprise first, second and third voltage sources coupled in series across said power source to provide a first voltage, a second voltage and a third voltage, respectively;

the series connection of said first, second and third voltage sources operating as said first voltage source means for applying across said control electrodes of said first and second transistors the sum of said first, second and third voltages;

said first voltage source operating as said second voltage source means for applying said first voltage across said control electrodes of said first and fourth transistors; and said third voltage source operating as said third voltage source means for applying said third voltage across said control electrodes of said second and third transistors.

15. The audio amplifier of claim 2, wherein:

said first to third voltage source means comprise a fourth voltage source coupled across said power source for providing a fourth voltage;

said fourth voltage source operating as said first voltage source means for applying said fourth voltage across said control electrodes of said first and second transistors;

said first to third voltage source means further comprising fifth and sixth voltage sources respectively having a fifth voltage and a sixth voltage both of an opposite polarity to said fourth voltage and coupled at both sides of an in series with said fourth voltage source;

said fifth voltage source operating as said second voltage source means for applying said fifth voltage across said control electrodes of said first and fourth transistors; and said sixth voltage source operating as said third voltage source means for applying said sixth voltage across said control electrodes of said second and third transistors.

* * * * *